(12) United States Patent
Park et al.

(10) Patent No.: US 7,026,658 B2
(45) Date of Patent: Apr. 11, 2006

(54) ELECTRICAL CONDUCTORS IN AN ELECTROLUMINESCENT DISPLAY DEVICE

(75) Inventors: Jin-Woo Park, Yongin (KR); Jae-Bon Koo, Yongin (KR); Kwan-Hee Lee, Seoul (KR)

(73) Assignee: Samsung SDI, Co., Ltd., Suwon-si (KR)

( * ) Notice: Subject to any disclaimer, the term of this patent is extended or adjusted under 35 U.S.C. 154(b) by 118 days.

(21) Appl. No.: 10/766,913

(22) Filed: Jan. 30, 2004

(65) Prior Publication Data

US 2004/0185604 A1 Sep. 23, 2004

(30) Foreign Application Priority Data

Mar. 13, 2003 (KR) .................. 10-2003-0015686
May 1, 2003 (KR) .................. 10-2003-0027991

(51) Int. Cl.
*H01L 29/22* (2006.01)

(52) U.S. Cl. .................. 257/98; 257/79; 257/88; 257/91; 257/99

(58) Field of Classification Search .............. 257/79, 257/88, 91, 98, 99; 345/32, 82
See application file for complete search history.

(56) References Cited

U.S. PATENT DOCUMENTS

| | | | |
|---|---|---|---|
| 5,851,709 A | 12/1998 | Grande et al. | |
| 5,981,306 A | 11/1999 | Burrows et al. | |
| 6,476,783 B1 * | 11/2002 | Matthies et al. | 345/82 |
| 6,509,691 B1 * | 1/2003 | Yamazaki et al. | 315/169.3 |
| 6,768,534 B1 * | 7/2004 | Iwase et al. | 349/153 |
| 6,870,519 B1 * | 3/2005 | Sundahl | 345/1.3 |
| 2001/0019243 A1 * | 9/2001 | Hidler | 313/505 |
| 2003/0052869 A1 * | 3/2003 | Fujii et al. | 345/204 |

FOREIGN PATENT DOCUMENTS

KR     1999-0082912     11/1999

OTHER PUBLICATIONS

*Office Action* from the Korean Industrial Property Office issued in Applicant's corresponding Korean Patent Application No. 10-2003-0027991 dated Jun.14, 2005.

* cited by examiner

*Primary Examiner*—Christian D. Wilson
*Assistant Examiner*—Douglas Menz
(74) *Attorney, Agent, or Firm*—Robert E. Bushnell, Esq.

(57) ABSTRACT

Provided is an electroluminescent display device having a negligibly small voltage drop of a cathode, no external light reflection, and high contrast and luminance. The electroluminescent display device includes a rear substrate, a first electrode layer formed above the rear substrate, a second electrode layer formed above the first electrode layer, the second electrode layer facing the first electrode layer, a light-emitting layer interposed between the first electrode layer and the second electrode layer, the light-emitting layer having at least an emission layer, a front substrate facing the rear substrate and contacting an upper surface of the second electrode layer, and a functional thin film formed between the second electrode layer and the front substrate, the functional thin film having a conductive material at least in a portion thereof contacting the second electrode layer.

21 Claims, 8 Drawing Sheets

ELECTRICAL CONDUCTORS IN AN ELECTROLUMINESCENT DISPLAY DEVICE

CLAIM OF PRIORITY

This application claims priority to an application entitled "ELECTROLUMINESCENT DISPLAY DEVICE", filed in the Korean Intellectual Priority Office on 13 Mar. 2003 and assigned Serial No. 2003-15686, and filed on 1 May 2003 and assigned Serial No. 2003-27991, the contents of that are hereby incorporated by reference.

BACKGROUND OF THE INVENTION

1. Field of the Invention

The present invention relates to an electroluminescent display device, and more particularly, to a design for conductors in an electroluminescent display device that reduces a voltage drop in an electrode layer on the light emitting side of an electroluminescent display device having a large screen size.

2. Description of the Related Art

Since electroluminescent display devices have superior viewing angle, contrast, response time, weight, size, thickness, and power consumption compared to cathode ray tubes (CRTs) and liquid crystal displays (LCDs), much attention has been paid to electroluminescent display devices as new generation display devices. Electroluminescent display devices can be active or passive light-emitting display devices. Electroluminescent display devices can also be classified into inorganic and organic electroluminescent display devices according to whether a light-emitting layer is made of an inorganic or organic material.

In electroluminescent display devices, a color display can be obtained in different ways, for example, by arranging individual light-emitting elements corresponding to three colors (red, green, and blue) side-by-side on a substrate, by using a blue light-emitting panel and a color conversion layer that is mounted on a front or rear substrate of the panel, or by using a white light-emitting panel and a color filter.

U.S. Pat. No. 5,059,861 to Littman et al discloses an electroluminescent display device having a cathode made of an alkaline metal and a plurality of metals other than the alkaline metal. U.S. Pat. No. 5,047,687 to VanSlyke discloses an electroluminescent display device having a cathode made of a plurality of metals, at least one of which is a low work function metal other than an alkaline metal. Here, the low work function metal is aluminum, vanadium, etc. U.S. Pat. No. 5,073,446 to Scozzafava et al, Japanese Patent Laid-Open Publication No. Hei. 5-36475, Hei. 8-222368, and Hei. 7-161474 disclose an anode, a laminated structure of a light-emitting layer, a cathode, an encapsulation layer and a sealing layer for protection of the cathode.

Meanwhile, the above-described conventional electroluminescent display devices undergo a significant voltage drop due to a long distance from a cathode power supply source to some of the pixels in a large display. For this reason, uniform luminance and definition are not ensured. The voltage drop occurs due to high resistance of the cathode electrode and lead lines. For this reason, a voltage difference between a near region and a far region from a cathode power supply source is present.

Such a voltage drop becomes more problematic in front emission type electroluminescent display devices which has an high opening ratio. U.S. Pat. No. 5,981,306 to Burrows et al. discloses an organic light-emitting device that is a front emission type electroluminescent display device. A cathode electrode layer of the organic light-emitting device in Burrows '306 is made up of a thin metal layer and an indium tin oxide (ITO) layer that is deposited on the thin metal layer. ITO is used in Burrows '306 because it is both conductive and it is transparent to light. However, use of ITO for an electrode can become problematic in electroluminescent display devices having a large screen size because ITO has a high enough resistivity to cause a voltage IR drop, especially for large screen sizes. When such a voltage drop occurs, some pixels receive less voltage than other pixels, leading to non-uniform luminance distribution across the display.

U.S. Pat. No. 5,851,709 to Grande et al. discloses an electroluminescent display device with a color filter with an organic layer. However, Grande '709 is silent regarding the electrodes used.

In case of a front emission type electroluminescent display device, it is required that an electrode adjacent to a front substrate is made of a material that is both transparent and conductive, such as indium tin oxide (ITO) and indium zinc oxide (IZO). ITO or IZO is deposited at a low temperature after forming a light-emitting layer to minimize deterioration of the light-emitting layer due to heat or plasma. However, an ITO or IZO layer thus formed at a low temperature has poor film quality and resistivity, and thus, a voltage drop phenomenon becomes significant. Consequently, there arises a problem such as non-uniform luminance distribution of images displayed in electroluminescent display devices, particularly when the screen size is very large.

Also, pixels created by light emission from a light-emitting layer undergo color interference, by which creating high-definition images is difficult. In addition, such a transparent and conductive materials like ITO generally has a high resistance, especially when there is a large screen size. Therefore, in a case where an electrode for a large-sized electroluminescent display device is made of such a material, an IR voltage drop occurs across the ITO electrode. This voltage drop on the electrode can be problematic because it causes a non-uniform luminance distribution across the large screen of the display.

SUMMARY OF THE INVENTION

It is therefore an object of the present invention to provide an improved design of an electroluminescent display device having a large screen size.

It is further an object of the present invention to provide a novel design for an electroluminescent display device having a large screen where the electrode on the light emitting side is designed to have a negligibly small voltage drop across it.

It is further an object of the present invention to provide a front emitting electroluminescent display device having a large screen where the electrode on the front side is designed to allow the light to pass while not causing any significant IR voltage drops, thus resulting in a large screen having a uniform luminance distribution.

It is still yet another object of the present invention to provide a design for an electroluminescent display device having a large display where the display has a uniform luminance distribution across the entire display.

It is still yet another object of the present invention to provide an electrode design on the light emitting side of an electroluminescent device that is made of materials having lower resistivity than ITO.

It is still yet another object of the present invention to provide an electroluminescent display device having no color blurring, high-definition image, and high opening ratio.

It is yet further an object of the present invention to provide a design for an electroluminescent display that absorbs light originating from an outside source and impinging on the display, thus preventing the reflection of this outside light off the display.

It is yet another object of the present invention to provide a front emisson type electroluminescent display device that reduces the voltage drop of a cathode and prevents external light reflection.

These and other objects may be achieved by a front emitting electroluminescent display device that uses a patterned black matrix layer as part of an electrode on the front side of a front emitting light emitting layer. The black matrix layer is patterned to inhibit the passage of as little light as possible while providing a more conductive conductor than traditional ITO for the electrode on the light emitting side of the light emitting layer. This black matrix layer conveys power in a horizontal direction to the light emitting layer. In addition, it is contemplated that there is an electrode layer in direct contact with the light emitting layer on the side of the emission. This electrode layer is made of a material that is both conductive and transparent, such as ITO. This ITO conveys power and voltage in a vertical layer. This electrode layer is preferably connected to the black matrix layer via a connecting member. The connecting members are made out of conducting material. Therefore, the electrode on the light emitting side of the electroluminescent device has ITO electrode layer, a black matrix layer and possibly a metallic connector therebetween, instead of only using only ITO. The voltage applied across each light emitting layer can be made more uniform across the entire display, even when the screen size is large. Because the amount of ITO is reduced in the electrode structure on the light emitting side of the electroluminescent device, there is negligibly small voltage drop across the electrode, thus providing uniform luminance, even for a big display.

The connecting members may be conductive spacers interposed between the front side or second electrode layer and the black matrix layer. The conductive spacers may be made of a polymer particle, the outer surface of that is coated with a metal. The connecting members may be protrusions protruding from the black matrix layer. The connecting members may be made of Ni, Al, Ag, Au, Cu, or an alloy thereof. A transparent filler fixing the connecting members may be interposed between the second electrode layer and the black matrix layer to prevent the connecting members from moving. The connecting members may have a height of 2 to 30 μm.

The electroluminescent display device may further include a color filter layer, that is formed on the remaining lower surface of the front substrate on the same layer that the patterned black matrix layer is found. By using a black matrix layer and a metallic connecting members instead of only a transparent and conductive material for a light emitting side electrode, the voltage drop in the electrode on the light emitting side is reduced, enabling a large display to have a more uniform luminance.

According to another aspect of the present invention, there is provided an electroluminescent display device, having a rear substrate, a first electrode layer formed above the rear substrate, a second electrode layer formed above the first electrode layer, the second electrode layer facing the first electrode layer, a light-emitting layer interposed between the first electrode layer and the second electrode layer, the light-emitting layer having at least an emission layer; a front substrate facing the rear substrate and contacting an upper surface of the second electrode layer, and a functional thin film formed between the second electrode layer and the front substrate, the functional thin film having a conductive material at least in a portion thereof contacting the second electrode layer.

The functional thin film may be made of a first ingredient that is a transparent material and a second ingredient that is a metal material, which are sequentially stacked from the front substrate. The content of the first ingredient may decrease and the content of the second ingredient may increase with increasing vertical distance from the front substrate. The first ingredient may be a transparent insulating material such as $SiO_x(x \geq 1)$, $SiN_x(x \geq 1)$, $MgF_2$, $CaF_2$, $Al_2O_3$ or $SnO_2$ or a transparent conductive material such as ITO, IZO, ZnO, and $In_2O_3$. The second ingredient preferably contains Fe, Co, V, Ti, Al, Ag, Si, Ge, Y, Zn, Zr, W, Ta, Cu or Pt. Alternatively, the functional thin film may be made out of $CrO_x$ ($x \geq 1$) on the front substrate and a layer of Cr on the $CrO_x$ layer.

A conductive spacer or a conductive paste may be interposed between the functional thin film and the second electrode layer. The functional thin film can be black in color and thus absorbs incident light from the outside impinging on the front substrate. Also, the functional thin film may have openings corresponding to a predetermined pixel pattern near or corresponding to a light-emitting area. The openings of the functional thin film may be patterned in the form closed polygons, squares, dots or stripes. The paste that connects the functional thin film to the second electrode may also have openings that coincide with the openings in the functional thin film to allow light from the emission layer to emerge from the front side of the display.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in that like reference symbols indicate the same or similar components, wherein.

DETAILED DESCRIPTION OF THE INVENTION

Figure 1:
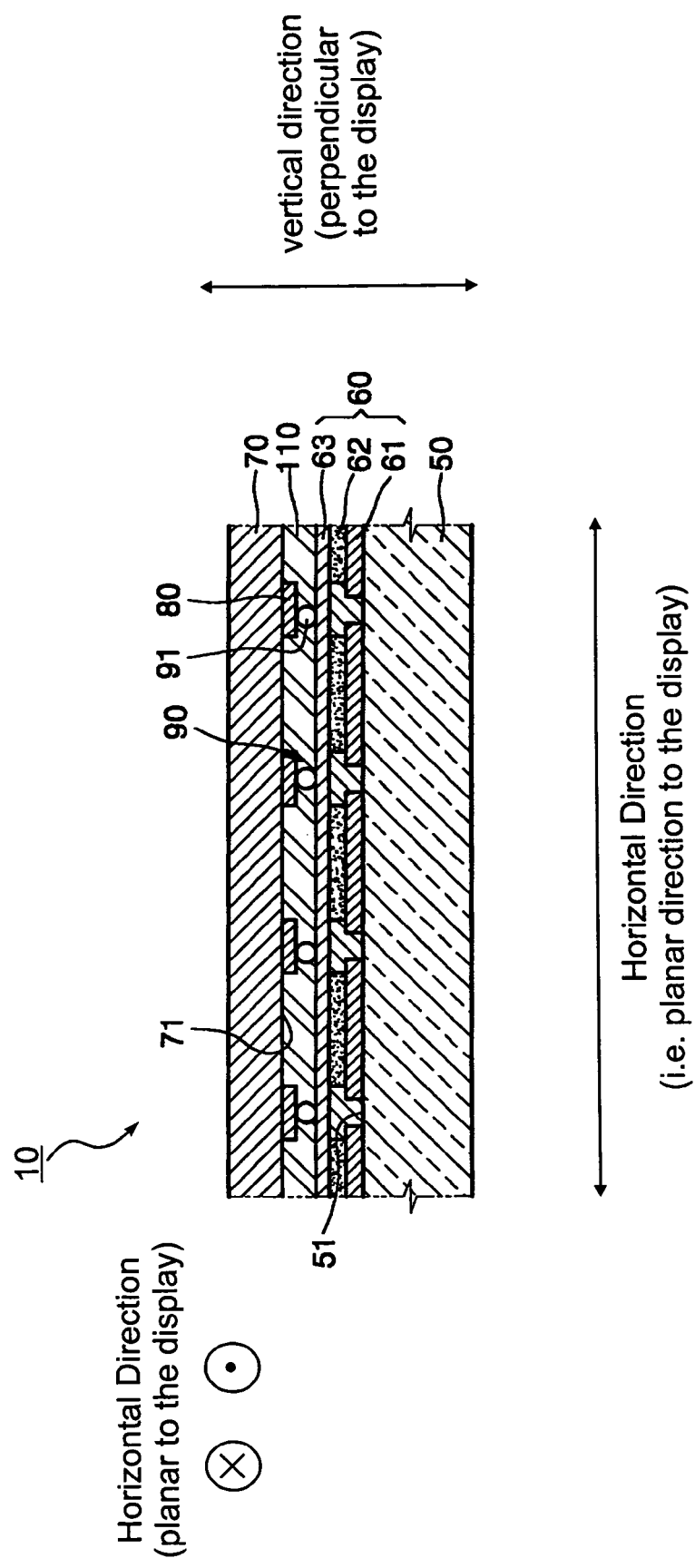
FIG. 1 is a sectional view of a passive electroluminescent display device according to a first embodiment of the present invention illustrating horizontal and vertical directions.

Turning now to the figures, FIG. 1 illustrates an electroluminescent display device 10 according to the first embodiment of the present invention. Display device 10 is a passive device 11 with a front emitting structure and is made up of a rear substrate 50 and a front substrate 70 that are coupled with each other. On an upper surface 51 of the rear substrate 50, a first electrode layer 61, a light-emitting layer 62, and a second electrode layer 63 are orderly formed. The first electrode layer 61, the light-emitting layer 62, and the second electrode layer 63 constitute a light-emitting unit 60. On a lower surface 71 of the front substrate 70, a conductive black matrix layer 80 is formed in a predetermined pattern to face the second electrode layer 63. The term, "predetermined pattern" as used herein indicates a pattern designed for inhibiting the passage of as little light as possible emitted from the light-emitting layer 62 toward the front substrate 70. The term "predetermined pattern" also infers that the black matrix layer is patterned to produce improved contrast of the image displayed on the electroluminescent display device.

In the present invention, second electrode layer 63 is made of a material that is both conductive and transparent such as ITO. Patterned black matrix layer 80 delivers electrical power in a planar direction (a horizontal direction or a direction parallel to the front and rear substrates or right and left directions and in and out of the page directions as illustrated in FIG. 1) of the display and to the light-emitting layer 62 via second electrode layer 63. Since the black matrix layer 80 is made of material having good electrical conductivity, such as aluminium or copper, there is no significant IR drop in the planar direction (or horizontal direction or a direction parallel to the front and rear substrates) of the display that previously occurred when the electrical power was delivered in the planar direction of the display by the second electrode layer 63 made of material having bad electrical conductivity, such as ITO. The present invention still uses relatively highly resistive ITO or IZO for the electrodes to deliver power to the light-emitting layer 62, but only for connections oriented in the vertical direction that is perpendicular to the front and rear substrates (illustrated as up and down directions in FIG. 1). However, the long horizontal components of the lead lines in the present invention are made of a less resistive black matrix layer or functional thin film layer and not the highly resistive ITO or IZO.

The light-emitting layer 62 is interposed between the first and second electrode layers 61 and 63 and emits light when these electrode layers are driven electrically. An electroluminescent display device according to this embodiment of the present invention may be an organic electroluminescent display device or an inorganic electroluminescent display device according to whether the light-emitting layer 62 is made of an organic or inorganic material.

With respect to an organic electroluminescent display device, the light-emitting layer 62 is made of phthalocyanine such as copper phthalocyanine (CuPc), N,N'-di(naphthalene-1-yl)-N,N'-diphenyl-benzidine (NPB), tris-8-hydroxyquinoline aluminium (Alq3) or the like. Regarding an inorganic electroluminescent display device, the light-emitting layer 62 is made of metal sulfide such as ZnS, SrS, and CsS, or alkaline earth-based calcium sulfide such as $CaCa_2S_4$ and $SrCa_2S_4$, and emitting core atoms of element such as alkaline rare earth metal and transition metal, for example Mn, Ce, Th, Eu, Tm, Er, Pr, and Pb. Although an organic electroluminescent display device is illustrated in FIG. 1, an inorganic electroluminescent display device is also within the scope of the present invention. In the case of an inorganic electroluminescent display device, insulating layers are formed on the respective opposite surfaces of the first and second electrode layers 61 and 63.

The second electrode layer 63 and the black matrix layer 80 in this embodiment are connected to each other through a plurality of conductive connecting members. According to this embodiment of the present invention, the conductive connecting members are conductive spacers 91 interposed between the second electrode layer 63 and the black matrix layer 80, but are not limited thereto. Preferably, the conductive connecting members are made of a metal with good electroconductivity, such as Ni, Al, Ag, Au, Cu, and an alloy thereof. The connecting members may be formed with a cross-section of various shapes such as square, triangle, and circle. The connecting members may be made of a single conductive material, or alternatively, of a polymer particle, the outer surface of that is coated with a metal. Preferably, the height of the connecting members, i.e., the length of the top and bottom of the connecting members as viewed from FIG. 1 is in the range of 2 to 30 µm. The distribution density of the connecting member, i.e., the ratio of the cross sectional area the connecting members over the entire cross-sectional area between second electrode layer 63 and black matrix layer 80 is preferably less than 10%.

Meanwhile, when the connecting members are interposed between the second electrode layer 63 and the black matrix layer 80, spaces are defined between these connecting members. If these spaces are not filled with a material, the connecting members can move or shift in position. This movement of the connecting members or conductive spacers 91 may cause electric discontinuity between the second electrode layer 63 and the patterned black matrix layer 80. Therefore, it is preferable to fill a transparent and non-conducting filler 110 between the second electrode layer 63 and the black matrix layer 80 to keep the spacers 91 in place and prevent the spacers 91 from moving.

In a case where an electroluminescent display device 10 according to this embodiment of the present invention is a front emission type, i.e., in a case where light generated in the light-emitting layer 62 is discharged through the second electrode layer 63 and the front substrate 70, the second electrode layer 63 is made of a transparent and conductive material such as indium tin oxide (ITO). According to this embodiment of the present invention, the second electrode layer 63 is electrically connected to the conductive black matrix layer 80 through the connecting member or spacer 91. Therefore, the black matrix layer 80 with small electric resistance can serve as a bus electrode for the second electrode layer 63, and thus, the voltage drop between a power or voltage supply and the light emitting layer 62 is reduced over the scenario when only ITO and not a black matrix layer are used. The black matrix layer 80 may be made of a single homogeneous material. Alternatively, the black matrix layer 80 may be a thin film made of a combination of conductive material and a dielectric material. This combination may be homogeneous or may very in such a way that a concentration gradient of the conductive and dielectric materials very in some way along the thickness of the thin film (to be discussed in FIGS. 5 through 10 in the fifth and sixth embodiments of the present invention). In these later embodiments, the conductive material-rich side of the black matrix layer 80 is in contact with the connecting member or spacer 91.

Figure 2:
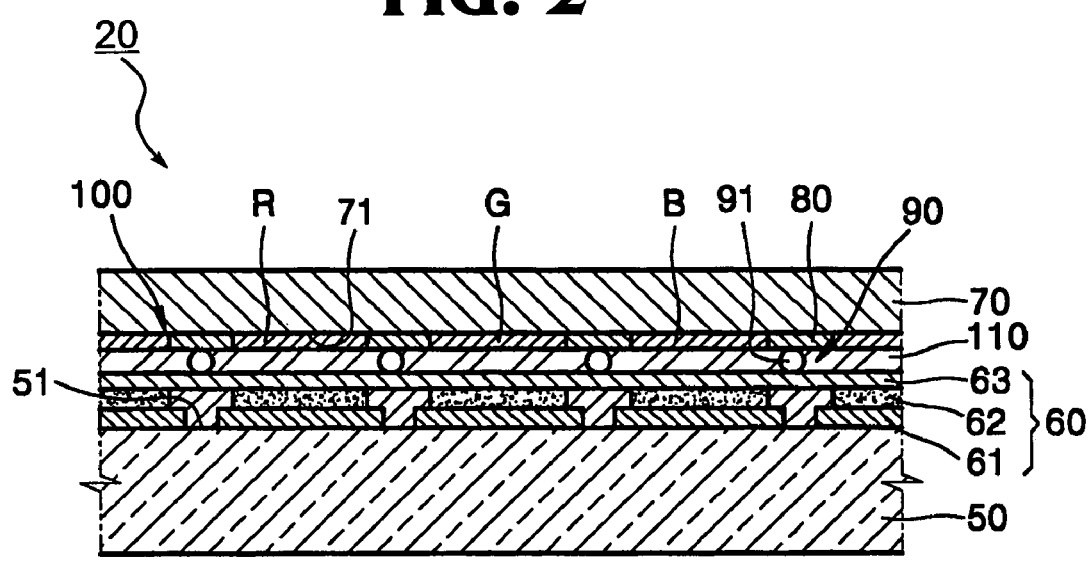
FIG. 2 is a sectional view of a passive electroluminescent display device according to a second embodiment of the present invention.

An electroluminescent display device 20 according to a second embodiment of the present invention will now be described with reference to FIG. 2, in view of technical constructions different from the first embodiment of the present invention. This second embodiment of the present invention differs from the first embodiment of the present invention in that the second embodiment includes red, blue, and green color filter layers R, G and B formed on the lower surface 71 of the front substrate 70 facing the light-emitting unit 60. The color filter layers R, G and B are disposed on the same layer as the patterned black matrix layer material. The R, G and B layers are separated from each other by the black matrix layer 80. As in the first embodiment, the use of a patterned black matrix layer 80 and a conductive spacer 91 are used in the color filter structure 20 of the second embodiment to conduct power to the second electrode layer 63 to energize the light emitting layer 62.

An electroluminescent display device 30 according to a third embodiment of the present invention will now be described with reference to FIG. 3, in view of technical constructions different from the second embodiment of the present invention. This embodiment of the present invention differs from the second embodiment of the present invention in that protrusions 92 protruding from the black matrix layer 80 are used as members for connecting the second electrode layer 63 and the black matrix layer 80 to each other. These protrusions 92 are used in this third embodiment instead of spacers 91 used in the first two embodiments of the present invention.

Figure 3:
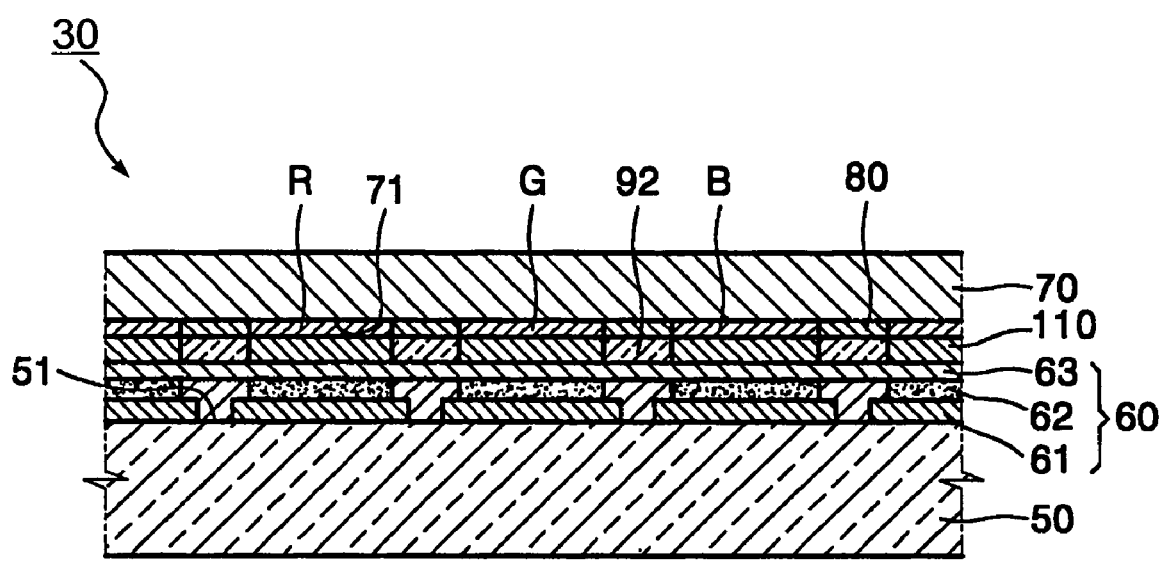
FIG. 3 is a sectional view of a passive electroluminescent display device according to a third embodiment of the present invention.

Referring to FIG. 3, the conductive protrusions 92 are formed on the black matrix layer 80 that is formed on the lower surface 71 of the front substrate 70 corresponding to regions between pixels of the light-emitting unit 60. The protrusions 92 may be made of conductive particles that are adhered to the black matrix layer 80 by a conductive paste. Color filter layers R, G, and B may be formed on the remaining lower surface 71 of the front substrate 70, on the same level as the patterned black matrix layer 80 between patterned portions of the black matrix layer 80. Preferably, a transparent and non-conducting filler 110 is interposed between each of the R, G and B color filter layers and the light-emitting unit 60. Non-conductive filler 110 is also disposed between adjacent conductive protrusions 92 in this third embodiment of the present invention.

An electroluminescent display device 200 according to a fourth embodiment of the present invention will now be described with reference to FIG. 4, in view of technical constructions different from the first embodiment of the present invention. This embodiment of the present invention differs from the first three embodiments of the present invention in that a light-emitting unit is formed in an active matrix type, not in a passive matrix type as illustrated in FIGS. 1 through 3. In the active matrix type light emitting unit 200, a thin film transistor (TFT) 221 is present and a thin film capacitor 222 may be present.

Figure 4:
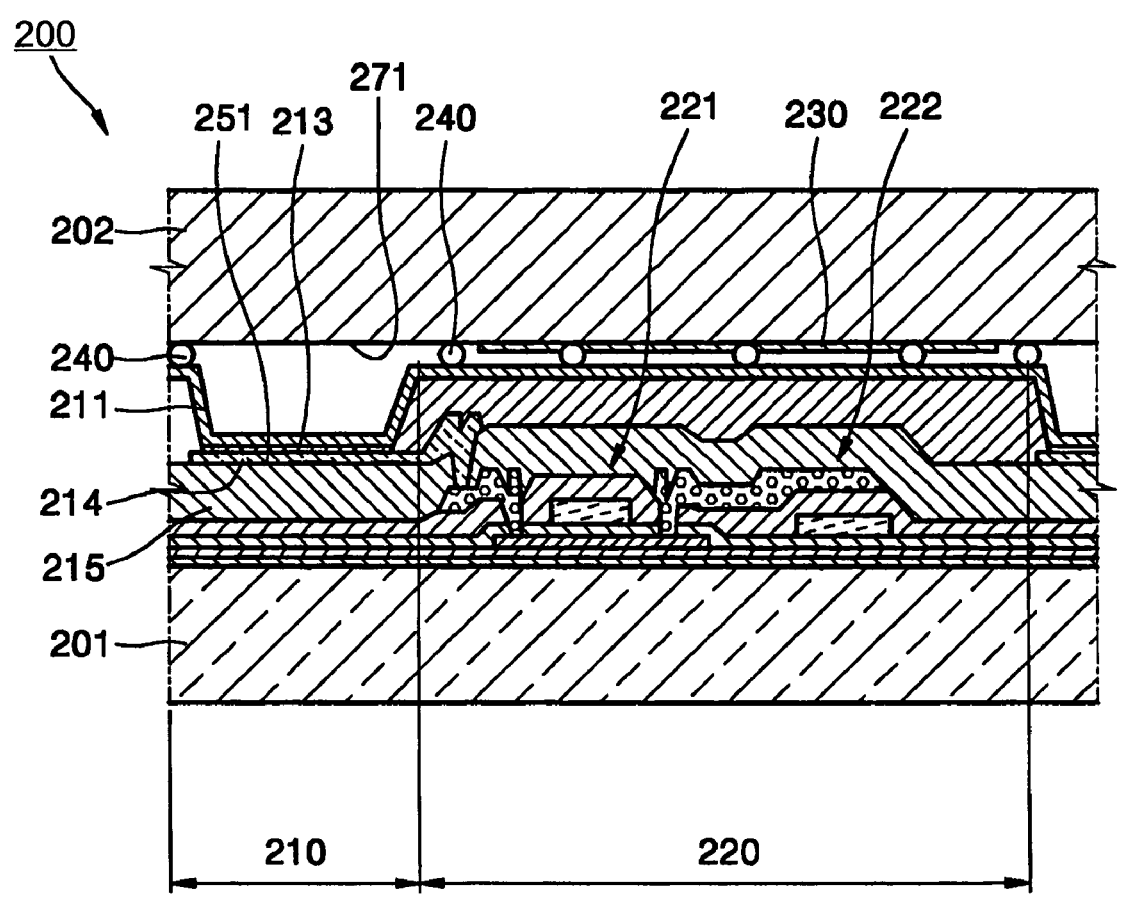
FIG. 4 is a sectional view of an active matrix electroluminescent display device according to a fourth embodiment of the present invention.

Referring to FIG. 4, the electroluminescent display device 200 has a light-emitting region 210 and a driving region 220 for driving a first electrode layer 214, both that are formed between a rear substrate 201 and a front substrate 202. The light-emitting region 210 contains the light-emitting unit made up of the first electrode layer 214, a light-emitting layer 213, and a second electrode layer 211. The light-emitting unit is formed on an upper surface 251 of an insulating layer 215. This same insulating layer 215 also covers a thin film transistor 221. The light-emitting layer 213 emits light when the first and second electrode layers 214 and 211 respectively are driven electrically. The driving region 220 is made up of the rear substrate 201 and the thin film transistor 221 for driving the first electrode layer 214. When needed, the driving region 220 may also include a capacitor 222 as illustrated in FIG. 4.

On a lower surface 271 of the front substrate 202, a black matrix layer 230 is formed. A plurality of connecting members such as conductive spacers 240 are interposed between the black matrix layer 230 and the transparent second electrode layer 211 to electrically connect black matrix layer 230 to each second electrode layer 211. Since only the second electrode layer 211 and not the black matrix layer 230 is made of a relatively highly resistive transparent conductive material, the voltage drop between the power supply or voltage source and each second electrode layer 211 in a display is low. Also, the potential at each second electrode layer 211 across the entire display is more uniform because there is little voltage drop across the black matrix layer 230. As in the first three embodiments, the fourth embodiment uses black matrix layer 230 and conductive spacers 240 to deliver power and voltage to the transparent second electrode layer 211 instead of using only transparent conductive material like ITO to connect each light emitting layer 213 in a display to the power or voltage source. Also like the first three embodiments, black matrix layer 230 in FIG. 4 is used to deliver power in a horizontal direction and not in a vertical direction to light emitting layer 213. As with the first three embodiments, a relatively high resistive transparent ITO or IZO is used to deliver power and voltage in the relatively short vertical direction to the light emitting layers 213.

An operation of the electroluminescent display device 200 according to this fourth embodiment of the present invention will now be described in detail. When a predetermined voltage is applied to the first electrode layers 214 by the thin film transistor 221, a hole from the first electrode layer 214 and an electron from the second electrode layer 211 recombine with each other in the light-emitting layer 213 to generate an exciton. When the exciton is changed from an excited state to a ground state, fluorescent molecules of the light-emitting layer 213 emit light. The light emitted is discharged through the transparent second electrode layer 211 out the front side of the display device 200.

Since the second electrode layer 211 is connected to the black matrix layer 230 by the conductive spacers 240, the voltage drop due to a long distance from a voltage applying element like a power supply is reduced. That is, the black matrix layer 230 serves as an auxiliary electrode for the second electrode layer 211, and thus, the voltage drop across the transparent conductive material in second electrode layer 211 is reduced. As apparent from the above descriptions, an electroluminescent display device according to the present invention reduces the voltage drop in a second electrode, and thus, exhibits uniform luminance distribution across a whole screen.

A fifth embodiment of the present invention will now be described in detail with reference to FIGS. 5, 6 and 7. An electroluminescent display device 300 of the present invention contains a thin film that acts as a black matrix layer and a conductive layer on the inner side of an encapsulation member or an encapsulation substrate. Therefore, the voltage drop of an electrode is reduced and color blurring is prevented.

Figure 5:
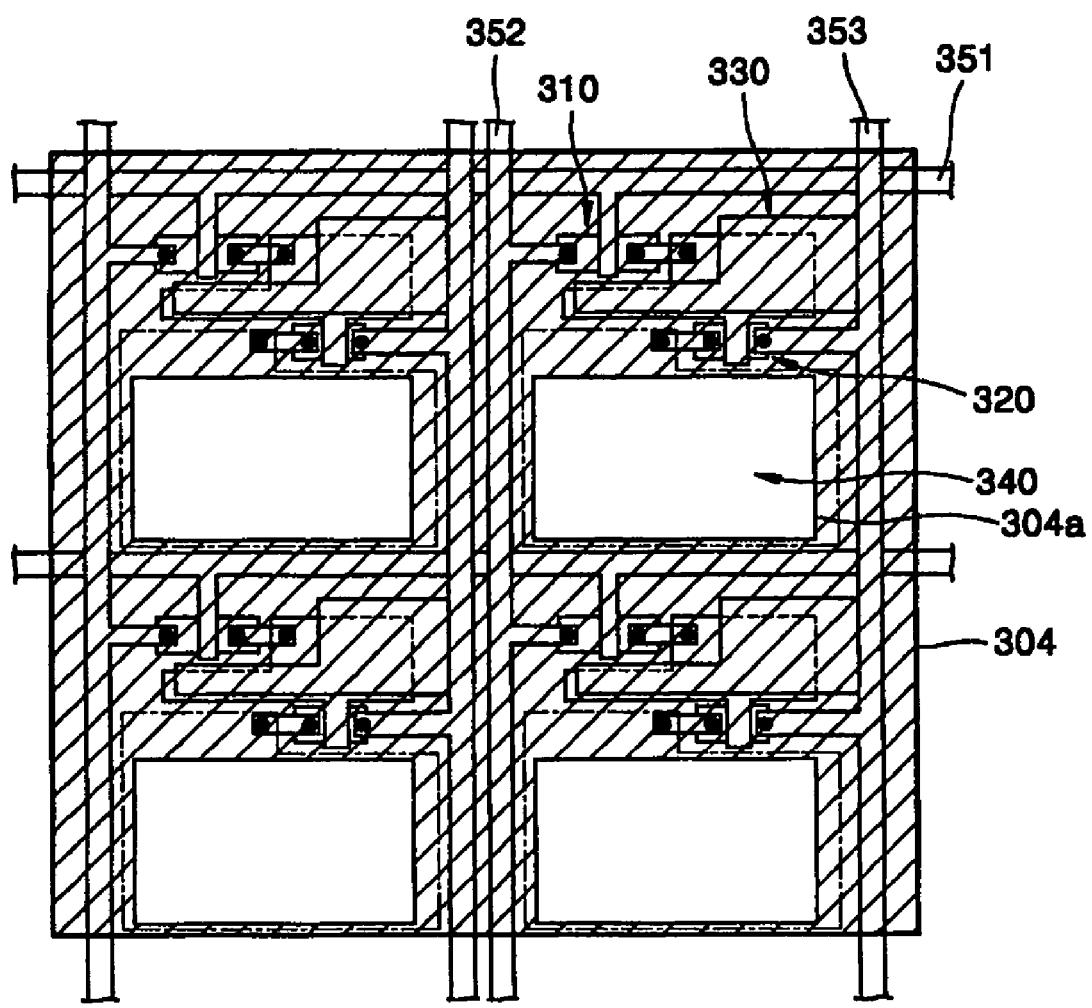
FIG. 5 is a plan view of an electroluminescent display device according to a fifth embodiment of the present invention.

FIG. 5 is a plan view that illustrates an example of an active matrix electroluminescent display device according to the fifth embodiment of the present invention. FIG. 6 illustrates a partial sectional view of the active matrix electroluminescent display device 300 of FIG. 5. Referring to FIG. 5, each sub-pixel of the active matrix electroluminescent display device according to a preferred embodiment of the present invention is made up of two thin film transistors (TFTs) including of a switching TFT 310 and a driving TFT 320, one capacitor 330, and one electroluminescent device (hereinafter, simply referred to as "EL device") 340. Since there is no limitation on the number of TFTs and capacitors, more TFTs and capacitors may be used.

The switching TFT 310 is driven by a scan signal applied to a gate line 351 and then transmits a data signal applied to a data line 352 to the driving TFT 320. The driving TFT 320 serves to determine the amount of current to be injected into the EL device 340 according to the data signal transmitted by the switching TFT 310, i.e., a voltage difference (Vgs) between a gate and a source. The capacitor 330 serves to store the data signal transmitted by the switching TFT 310 during one frame.

Figure 6:
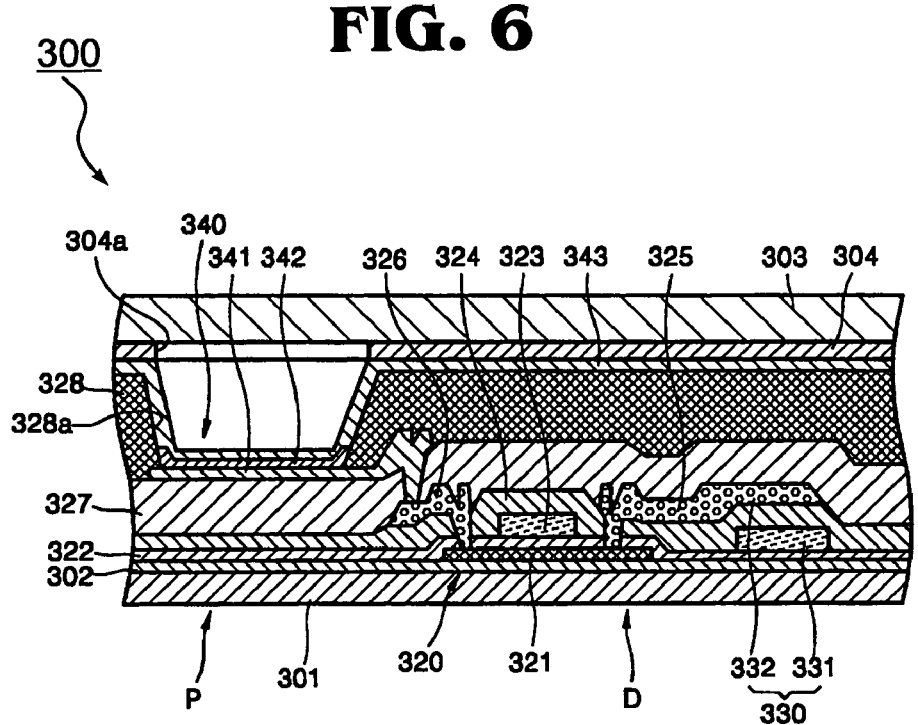
FIG. 6 is a partial sectional view of the electroluminescent display device of FIG. 5.

FIG. 6 is a sectional view that illustrates the EL device 340, the driving TFT 320, and the capacitor 330 of one sub-pixel of the electroluminescent display device 300 of FIG. 5, and will now be described in detail. A buffer layer 302 is formed on a first substrate 301 with insulating property. There is a pixel region P and a driving region D above the buffer layer 302. As used herein, the term "pixel region P" indicates a region that emits light from the EL device and the term "driving region D" indicates a region that contains the TFTs and the capacitor. Even though FIG. 6 illustrates only the driving TFT 320, the driving region D also contains the switching TFT 310.

As illustrated in FIG. 6, the driving TFT 320 of the driving region D has a semiconductor active layer 321 formed on the buffer layer 302, a gate insulator 322 formed on the semiconductor active layer 321, and a gate electrode 323 formed on the gate insulator 322. The semiconductor active layer 321 may be an amorphous silicon thin film or a polycrystalline silicon thin film. The semiconductor active layer 321 has source and drain regions doped with n- or p-type impurity at a high concentration. The gate insulator 322 made of $SiO_2$ is formed on the semiconductor active layer 321. The gate electrode 323 made of a conductive material such as MoW or Al/Cu is formed on a predetermined region of the gate insulator 322. The gate electrode 323 is connected to a first electrode 331 of the capacitor 33.0 and supplies a TFT on/off signal. The gate electrode 323 is formed above a channel region of the semiconductor active layer 321.

An inter-insulator 324 is formed on the gate electrode 323. A source electrode 325 and a drain electrode 326 contact the source region and the drain region of the semiconductor active layer 321 through contact holes. The source electrode 325 is connected to the driving line 353 of FIG. 5 and supplies a reference common voltage for driving the semiconductor active layer 321. The drain electrode 326 connects the driving TFT 320 and the EL device 340 and applies a driving power to the EL device 340. The driving line 353 is connected to a second electrode 332 of the capacitor 330.

A passivation film 327 made of $SiO_2$ is formed on the source and drain electrodes 325 and 326, respectively. A first electrode layer 341 of the EL device 340 is connected to the drain electrode 326 through the contact holes formed on the passivation film 327. The EL device 340 displays predetermined image information by emitting red, green, or blue light according to the amount of a current. As illustrated in FIG. 6, the EL device 340 includes the first electrode layer 341 acting as an anode that is connected to the drain electrode 325 of the driving TFT 320, a second electrode layer 343 acting as a cathode that covers entire pixels, and a light-emitting layer 342 interposed between the first electrode layer 341 and the second electrode layer 343. In this case, it is understood that the first electrode layer 341 can instead be used as a cathode and that the second electrode layer 343 can instead be used as an anode.

A planarization film 328 made of acrylic is formed on the first electrode layer 341 made of ITO. After forming a predetermined opening 328a in the planarization film 328, the light-emitting layer 342 and the second electrode layer 343 that is a cathode are orderly formed in the opening 328a. The light-emitting layer 342 may be a low molecular or high molecular light-emitting layer. The low molecular light-emitting layer may have a simple- or multi-laminated structure of a hole injection layer (HIL), a hole transport layer (HTL), an emission layer (EML), an electron transport layer (ETL), and an electron injection layer (EIL). The low molecular light-emitting layer may be made of one of various materials, including copper phthalocyanine (CuPc), N,N-di(naphthalene-1-yl)-N,N'-diphenyl benzidine (NPB), and tris-8-hydroxyquinoline aluminum (Alq3). The low molecular light-emitting layer may be formed by vapor deposition.

The high molecular light-emitting layer may have a structure is made up of a hole transport layer (HTL) and an emission layer (EML). In this case, the hole transport layer may be made of poly(ethylenedioxy)thiophene (PEDOT) and the emission layer may be made of a high molecular weight organic material such as poly(phenylene vinylene) (PPV) and polyfluorene. The high molecular light-emitting layer may be formed by screen printing or ink-jet printing.

The second electrode layer 343 that is a cathode may be formed by all-area deposition of Al/Ca in a rear emission type electroluminescent display device that emits light toward the rear substrate 301. On the other hand, in a front emission type electroluminescent display device that emits light toward a front substrate 303, the second electrode layer 343 may be formed by forming a semi-transmissible thin film made of metals such as Mg—Ag, followed by deposition of transparent ITO thereon.

In this way, the front substrate 303 is adjoined on the second electrode layer 343 and sealed. At this time, a predetermined functional thin film 304 is further formed between the second electrode layer 343 and the front substrate 303. The functional thin film 304 contains a conductive material at least in a portion thereof contacting the second electrode layer 343. Therefore, the functional thin film 304 can serve as a bus electrode preventing a substantial or significant the voltage drop that would have occurred in the second electrode layer 343 if second electrode layer were made without the functional thin film 304.

According to a preferred embodiment of the present invention, the functional thin film 304 is made of a first ingredient that is a transparent material and a second ingredient that is a metal material, which are sequentially stacked on the front substrate 303. The first ingredient and the second ingredient have an opposite concentration gradients, as illustrated in FIG. 7. That is, as a distance from the front substrate 303 increases, the content (or concentration) of the first ingredient decreases simultaneously as the content (or concentration) of the second ingredient increases.

Figure 7:
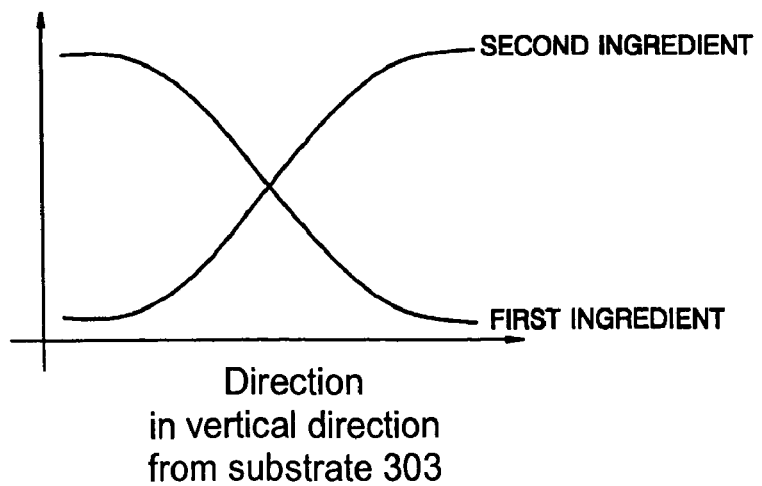
FIG. 7 is a view illustrating a concentration gradient of a conductive material and a dielectric material that make the functional thin film of FIGS. 5 and 6.

It is to be noted that the main difference between the present embodiment represented by FIGS. 5, 6 and 7 and the first four embodiments of the present invention represented by embodiments one through four is that the black matrix layers 80 and 230 are replaced by a functional thin film 304 made up of a conductive element and a dielectric element. Thus, functional thin film 304 is not homogeneous. Also, the fifth embodiment does not have a special spacer 91 or 240 to connect the functional thin film 304 to the second electrode layer 343.

Continuing with the fifth embodiment of the present invention, the first ingredient may be a transparent insulating material such as $SiOx(x \geq 1)$, $SiNx(x \geq 1)$, $MgF_2$, $CaF_2$, $Al_2O_3$ or $SnO_2$ or a transparent conductive material such as ITO, IZO, ZnO or $In_2O_3$. The second ingredient may be a metal material such as Fe, Co, V, Ti, Al, Ag, Si, Ge, Y, Zn, Zr, W, Ta, Cu, and Pt. The materials for the first and second ingredients of the functional thin film 304 are not limited thereto. That is, there are no particular limitations on the materials for the first and second ingredients of the functional thin film 304 provided that the first ingredient and the second ingredient have an opposite concentration gradient, and the second ingredient is concentrated on the lower surface of the functional thin film 304 contacting the second electrode layer 343 so that the functional thin film 304 can serve as a bus electrode for the second electrode layer 343.

Now the sixth embodiment of the present invention will now be discussed in conjunction with electroluminescent display device 400 illustrated in FIG. 8. The sixth embodiment is similar to the fifth embodiment except for the inclusion of a conductive spacer or a conductive paste 305 interposed between the functional thin film 304 and the second electrode layer 343 to improve electrical contact therebetween, as illustrated in FIG. 8.

Meanwhile, the functional thin film 304 is preferably black in color to absorb light and simultaneously serve as a bus electrode of the second electrode layer 343. Thus, functional thin film 304 can serve to absorb light originating from an outside source that impinges on the front of the display, preventing this light from reflecting off the front of the display and thus improving the image quality. This is especially true in front emission displays where it is not desirable to have external light reflecting off the front substrate 303. By having functional thin film black in color (i.e., black matrix), this reflection of external light can be prevented.

Figure 8:
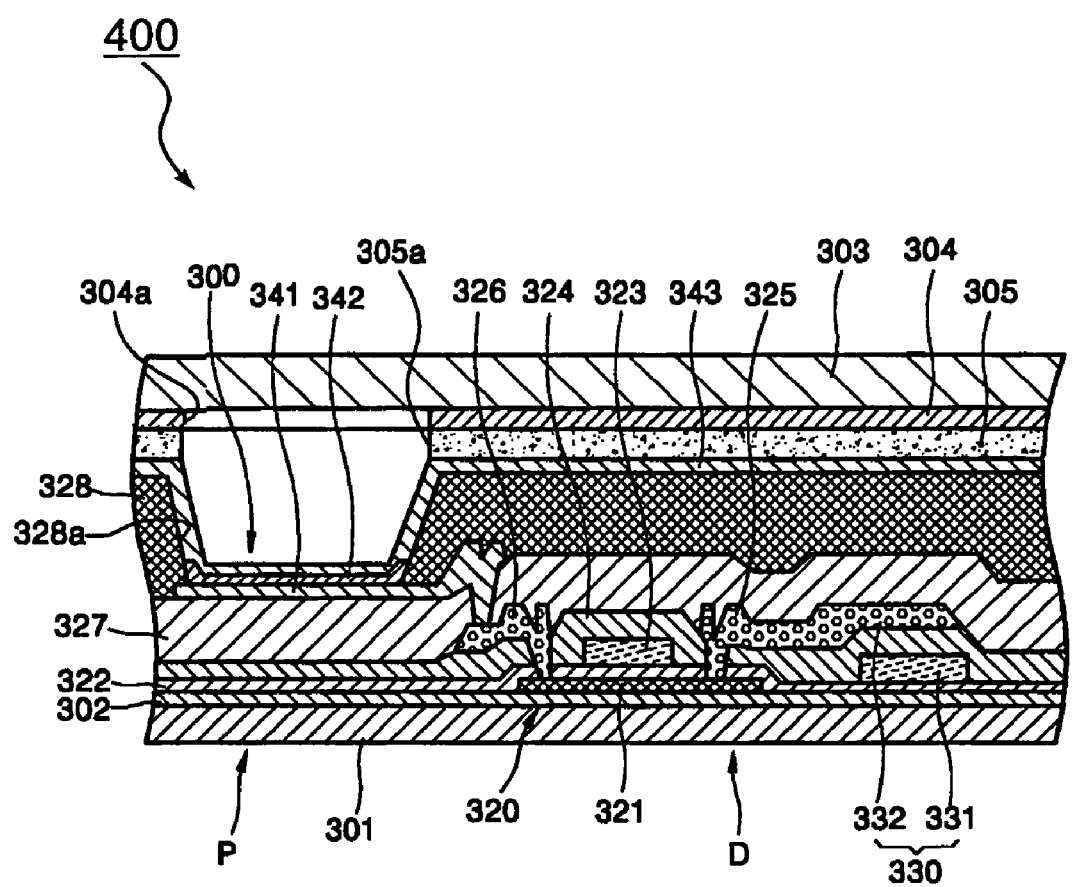
FIG. 8 is a sectional view of an electroluminescent display device according to a sixth embodiment of the present invention.
Figure 9:
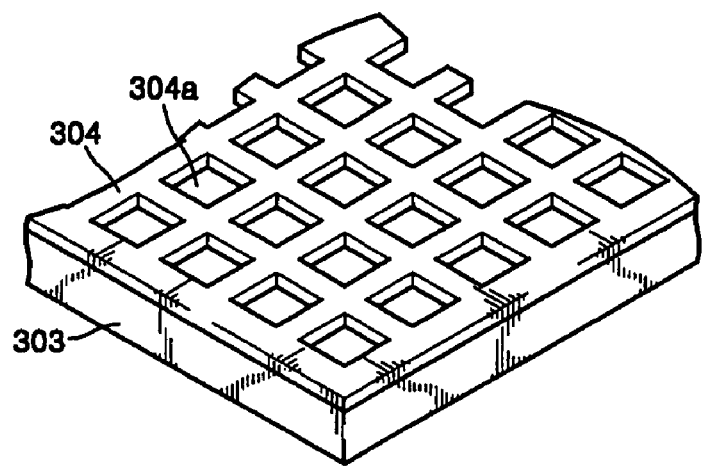
FIGS. 9 and 10 are perspective views that illustrate examples of functional thin films and their openings according to the fifth and sixth embodiments of the present invention.
Figure 10:
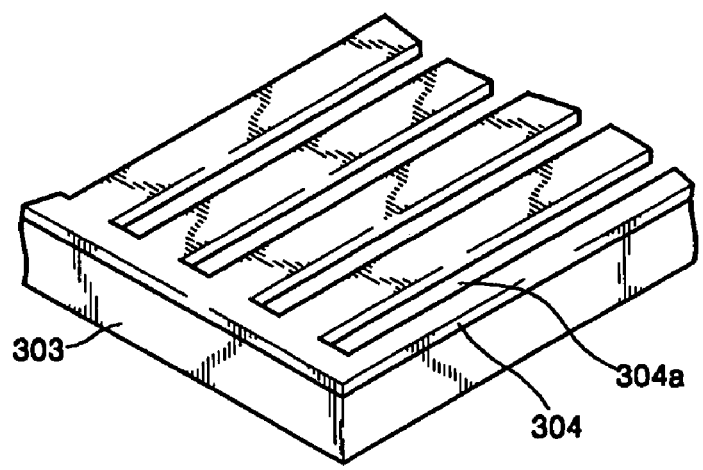

Also, as illustrated in FIGS. 6 and 8, an opening 304a must be patterned in the functional thin film 304 so that light emitted from the light-emitting layer 342 of the EL device 340 can be transmitted to the outside. That is, the opening 304a formed in the functional thin film 304 defines a light-emitting area of the pixel region P, as illustrated in FIGS. 6 and 8. The light-emitting area may be patterned in the form of a closed polygon, like a square or a dot, as illustrated in FIG. 9, or in the form of stripes, as illustrated in FIG. 10. In a case where the conductive spacer or conductive paste 305 is present as illustrated in FIG. 8, it is understood that a corresponding opening 305a is formed in the paste 305 to also allow light generated in light-emitting layer 342 to emerge from the display. Therefore, opening 305a in paste 305 is preferably the same size and shape and is coincident with opening 304a in functional thin film 304. In this way, the functional thin film 304 serves as a black matrix that prevents the occurrence of a substantial voltage drop in the second electrode layer 323 and prevents color interference among pixels.

Alternatively, the functional thin film 304 may be formed by various other methods. That is, the functional thin film 304 maybe formed by sequentially depositing, on the front substrate 303, a first thin film made of $CrOx$ ($x \geq 1$) and a second thin film made of Cr. Alternatively, the functional thin film 304 maybe a graphite-based black matrix having a conductive material layer on the surface thereof facing the second electrode layer 323.

In the above-described electroluminescent display device, when a predetermined voltage is applied to the first electrode layer 321 and the second electrode layer 323, holes from the first electrode layer that is an anode migrate toward the light-emitting layer and electrons from the second electrode layer are injected into the light-emitting layer. At this time, the electrons and the holes recombine with each other at the light-emitting layer to generate an exciton. When the exciton is changed from an excited state to a ground state, a fluorescent molecule of the light-emitting layer emits light, which displays an image. An electroluminescent display devices 300 and 400 driven as described above contains the functional thin film 304 formed between the second electrode layer 323 and the front substrate 303. Therefore, the voltage drop in the second electrode layer 323 can be reduced and external light reflection can be prevented.

While the fifth and sixth embodiments of the present invention have been described in terms of active matrix electroluminescent display devices, it is understood that the present invention can be applied to passive matrix electroluminescent display devices. However, since the passive matrix electroluminescent display devices may include a patterned cathode, the functional thin film may also be patterned accordingly. The present invention provides an electroluminescent display device that reduces the voltage drop in an electrode, thereby providing uniform luminance distribution, especially in large displays. The present invention also provides an electroluminescent display device having a high-definition image and a high opening ratio without color blurring. The present invention also provides an electroluminescent display device having low external light reflection off the display.

In addition, this invention is not limited to the exact embodiments presented here. In other words, it is not outside the scope of this invention to have the light emitting layer of the active device of the fourth embodiment be either organic or inorganic. Further, features from the first three embodiments may be incorporated within the active matrix device of the fourth embodiment.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. An electroluminescent display device, comprising:
a rear substrate comprising a first electrode layer, a light-emitting layer and a second electrode layer that are orderly formed on an upper surface of the rear substrate;
a front substrate, that is coupled with the rear substrate, the front substrate comprising a patterned conductive black matrix layer formed on a lower surface of the front substrate, the patterned black matrix layer facing the second electrode layer on the rear substrate; and a plurality of conductive connecting members disposed between the second electrode layer and the black matrix layer, the conductive connecting members electrically connecting the second electrode layer to the patterned black matrix layer.

2. The electroluminescent display device of claim 1, the connecting members being conductive spacers disposed between the second electrode layer and the patterned black matrix layer.

3. The electroluminescent display device of claim 2, an interior portion of the conductive spacers being a polymer particle, the outer surface of the conductive spacers being coated with a metal.

4. The electroluminescent display device of claim 1, the connecting members being protrusions protruding from the black matrix layer.

5. The electroluminescent display device of claim 1, the connecting members being made of a material selected from the group consisting of Ni, Al, Ag, Au, Cu, and an alloy thereof.

6. The electroluminescent display device of claim 1, further comprising a transparent filler material between adjoining connecting members, the transparent filler material being disposed between the second electrode layer and the black matrix layer, the transparent filler material being rigid and stable enough to prevent the connecting members from moving.

7. The electroluminescent display device of claim 1, the connecting members having a height of 2 to 30 μm.

8. The electroluminescent display device of claim 1, further comprising a color filter layer, the color filter layer being formed on a same level as the patterned black matrix layer.

9. The electroluminescent display device of claim 1, the black matrix layer being electrically connected to the second electrode layer without significant voltage drop.

10. The electroluminescent display device of claim 3, the metal portion of the connecting members being made of a material selected from the group consisting of Ni, Al, Ag, Au, Cu, and an alloy thereof.

11. The electroluminescent display device of claim 1, the light-emitting layer being organic.

12. The electroluminescent display device of claim 1, the light-emitting layer being inorganic.

13. The electroluminescent display device of claim 10, further comprising a color filter layer, the color filter layer being formed on a same level as the patterned black matrix layer.

14. The electroluminescent display device of claim 10, wherein the black matrix layer being electrically connected to the second electrode layer without significant voltage drop.

15. An electroluminescent display device, comprising:
 a rear substrate comprising thin film transistor, a first electrode layer driven by the thin film transistor, a light-emitting layer formed on the first electrode layer and a second electrode layer formed on the light-emitting layer;
 a front substrate that is coupled to the rear substrate, the front substrate comprising a patterned conductive black matrix layer that is formed on a lower surface of the front substrate and that faces the second electrode layer of the rear substrate coupled to the front substrate; and
 a plurality of conductive connecting members disposed between the second electrode layer and the patterned black matrix layer, the plurality of conductive connecting members electrically connecting the second electrode layer to the patterned black matrix layer.

16. The electroluminescent display device of claim 15, the connecting members being conductive spacers disposed between the second electrode layer and the patterned black matrix layer.

17. The electroluminescent display device of claim 16, the conductive spacers being made of a polymer particle, the outer surface of the conductive spacers being made of a conductive metal.

18. The electroluminescent display device of claim 15, the connecting members being protrusions protruding from the patterned black matrix layer.

19. The electroluminescent display device of claim 15, the connecting members being made of a material selected from the group consisting of Ni, Al, Ag, Au, Cu, and an alloy thereof.

20. The electroluminescent display device of claim 15, further comprising a transparent filler material between adjoining connecting members, the transparent filler material being disposed between the second electrode layer and the black matrix layer, the transparent filler material being rigid and stable enough to prevent the connecting members from moving.

21. The electroluminescent display device of claim 15, the connecting members having a height of 2 to 30 μm.

* * * * *